United States Patent
Kim

(10) Patent No.: US 9,417,647 B2
(45) Date of Patent: Aug. 16, 2016

(54) SEMICONDUCTOR INTEGRATED CIRCUIT DEVICE HAVING BULK BIAS CONTROL FUNCTION AND METHOD OF DRIVING THE SAME

(71) Applicant: SK hynix Inc., Icheon-si Gyeonggi-do (KR)

(72) Inventor: Yeon Uk Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/514,027

(22) Filed: Oct. 14, 2014

(65) Prior Publication Data

US 2016/0011620 A1  Jan. 14, 2016

(30) Foreign Application Priority Data

Jul. 8, 2014  (KR) .......... 10-2014-0085218

(51) Int. Cl.
*G05F 3/02* (2006.01)
*H03K 19/00* (2006.01)
*H03K 19/003* (2006.01)

(52) U.S. Cl.
CPC .............. *G05F 3/02* (2013.01); *H03K 19/0013* (2013.01); *H03K 19/0027* (2013.01); *H03K 19/00361* (2013.01)

(58) Field of Classification Search
CPC .................. H01L 27/1203; H01L 27/11546; G05F 3/02
USPC .......................... 257/156, 109, 330, 107, 131
See application file for complete search history.

(56) References Cited

U.S. PATENT DOCUMENTS 7,990,203 B2  8/2011  Kim
2011/0211717 A1*  9/2011  Hoevesteen .......... H04R 25/505
                                                        381/323

FOREIGN PATENT DOCUMENTS

KR  1020050091234 A  9/2005

* cited by examiner

*Primary Examiner* — Chuong A Luu
*Assistant Examiner* — Rodolfo Fortich
(74) *Attorney, Agent, or Firm* — William Park & Associates Ltd.

(57) ABSTRACT

A semiconductor integrated circuit device having a bulk bias control function is provided. The semiconductor integrated circuit device may be configured to output the first external voltage as a bulk voltage of a transistor in a power-up period, and to output a second external voltage having a higher level than the first external voltage as the bulk voltage of the transistor in a power-down mode.

8 Claims, 5 Drawing Sheets

SEMICONDUCTOR INTEGRATED CIRCUIT DEVICE HAVING BULK BIAS CONTROL FUNCTION AND METHOD OF DRIVING THE SAME

CROSS-REFERENCES TO RELATED APPLICATION

This application claims priority under 35 U.S.C. 119(a) to Korean application No. 10-2014-0085218, filed on Jul. 8, 2014, in the Korean intellectual property Office, which is incorporated by reference in its entirety as set forth in full.

BACKGROUND

1. Technical Field

The inventive concept generally relates to a semiconductor integrated circuit device, and more particularly, to a semiconductor integrated circuit device having a bulk bias control function, and a method of driving the same.

2. Related Art

In recent years, as semiconductor devices are increasingly scaled down, the density of transistors has increased rapidly, and voltage use has increasingly been lowered to reduce power consumption. To obtain the improved transition speed with a low voltage level, the threshold voltage is increasingly reduced, and thus sub-threshold leakage is emerging as a new problem.

To reduce the leakage current in the semiconductor integrated circuit devices, for example, semiconductor memory devices, a voltage having an absolute value larger than that of the source voltage is needed. This larger voltage is needed for providing the bulk of the transistors in a power-down mode.

Currently, in a PMOS transistor in which an external voltage VDD is applied as a source voltage, a boosting voltage VPP_EXT having a higher level than the external voltage may be applied as a bulk bias. In an NMOS transistor in which a ground voltage VSS is applied as a source voltage, a negative voltage VNN may be applied as a bulk bias.

However, with regards to a power-up period, the external voltage VDD, the boosting voltage may be abnormally input. Thus, an abnormal bulk voltage may be applied in a ramp-up period. This may cause bulk voltage reversal, and a large amount of leakage current may be generated.

SUMMARY

According to an embodiment, there is provided a semiconductor integrated circuit device. The semiconductor integrated circuit device may be configured to output a first external voltage as a bulk voltage of a transistor in a power-up period, and to output a second external voltage having a higher level than the first external voltage as the bulk voltage of the transistor in a power-down mode.

According to an embodiment, there is provided a semiconductor integrated circuit device. The semiconductor integrated circuit device may include a PMOS bulk bias generation block configured to output a first external voltage as a bulk voltage of a PMOS transistor in a power-up period and output a second external voltage having a higher level than the first external voltage as the bulk voltage of the PMOS transistor in a power-down mode, in response to a bulk bias enable signal and a leakage signal. The semiconductor integrated circuit device may also include a NMOS bulk bias generation block configured to output a ground voltage as a bulk voltage of an NMOS transistor in the power-up period and output a negative voltage having a higher absolute value than the ground voltage as the bulk voltage of the PMOS transistor in the power-down mode, in response to the bulk bias enable signal.

The PMOS bulk bias generation block may include a first bulk bias controller configured for generating a first control signal enabled when leakage is caused in response to the bulk bias enable signal and the leakage signal in the power-up period. The PMOS bulk bias generation block may also include a second bulk bias controller configured for generating a second control signal enabled in response to the bulk bias enable signal, the leakage signal, and a power-up signal in the power-down mode. The PMOS bulk bias generation block may also include a third bulk bias controller configured for strapping the second control signal to be disabled in the power-up period, and an output unit configured for outputting the first external voltage in response to the first control signal and for outputting the second external voltage in response to the second control signal.

According to an embodiment, there is provided a method of driving a semiconductor integrated circuit device. The method may include providing a first external voltage to a bulk of transistors during a power-up period. The method may also include providing a second external voltage higher than the first external voltage to the bulk of the PMOS transistors during a power-down mode.

DETAILED DESCRIPTION

Figure 1:
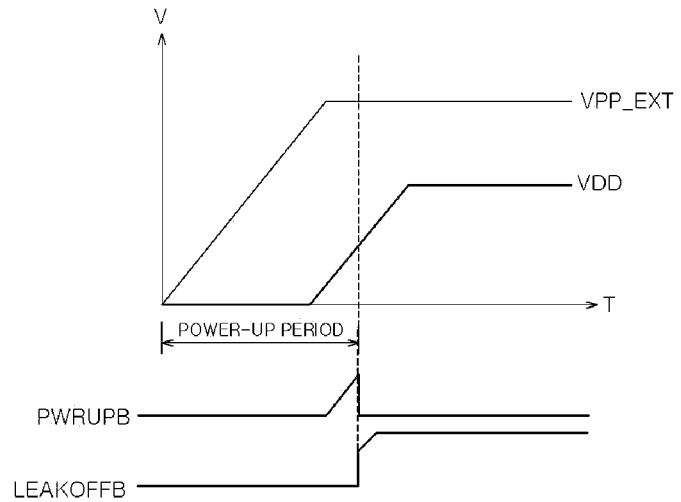
FIGS. 1 and 2 are graphs illustrating a representation of a leakage signal and a power-up signal according to voltage application in a power-up period according to an embodiment.

Hereinafter, various examples of embodiments will be described in greater detail with reference to the accompanying drawings. Various examples of embodiments are described herein with reference to cross-sectional illustrations that are schematic illustrations of various examples of embodiments (and intermediate structures). As such, variations from the shapes of the illustrations as a result, for example, of manufacturing techniques and/or tolerances, are to be expected. Thus, the various examples of the embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Although various examples of the embodiments will be illustrated and described, it will be appreciated by those of ordinary skill in the art that changes may be made in these various examples of the embodiments without departing from the principles and spirit of the disclosure.

Figure 2:
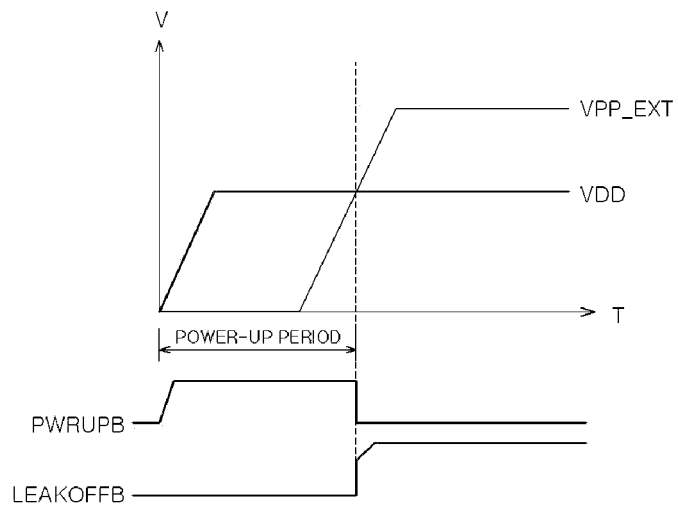

FIGS. 1 and 2 illustrate voltage V on the y-axis verses time T on the x-axis. As illustrated in FIGS. 1 and 2, a first external voltage VDD and a second external voltage VDD_EXT may be abnormally generated in a power-up period. That is, as illustrated in FIG. 1, in the power-up period, the second external voltage VPP_EXT may be normally generated, but the first external voltage VDD may not be normally generated. As illustrated in FIG. 2, in the power-up period, the first external voltage VDD may be normally generated, but the second external voltage VPP_EXT may not be normally generated. The abnormal generation of the external voltages may be caused by, for example, a loading capacitor of a circuit line or the like. A large amount of leakage current may be generated in a PMOS transistor due to the abnormal voltage generation. Here, the first and second external voltages VDD and VPP_EXT may be voltages provided from the outside. The second external voltage VPP_EXT having a higher level than the first external voltage VDD may be a voltage generated through boosting of the first external voltage VDD.

Figure 3:
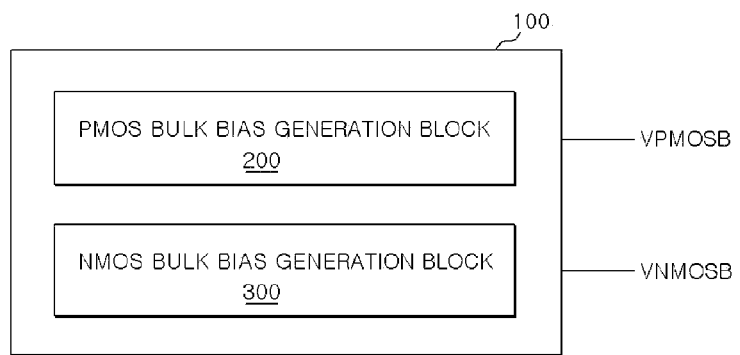
FIG. 3 is a block diagram illustrating a representation of a semiconductor integrated circuit device according to an embodiment.

To overcome the abnormal voltage generation, a semiconductor integrated circuit device 100 according to an embodiment may include a PMOS bulk bias generation block 200 and an NMOS bulk bias generation block 300 as illustrated in FIG. 3.

The PMOS bulk bias generation block 200 may be configured to generate a bulk bias VPMOSB of a PMOS transistor. The NMOS bulk bias generation block 300 may be configured to generate a bulk bias VNMOSB of an NMOS transistor.

Figure 4:
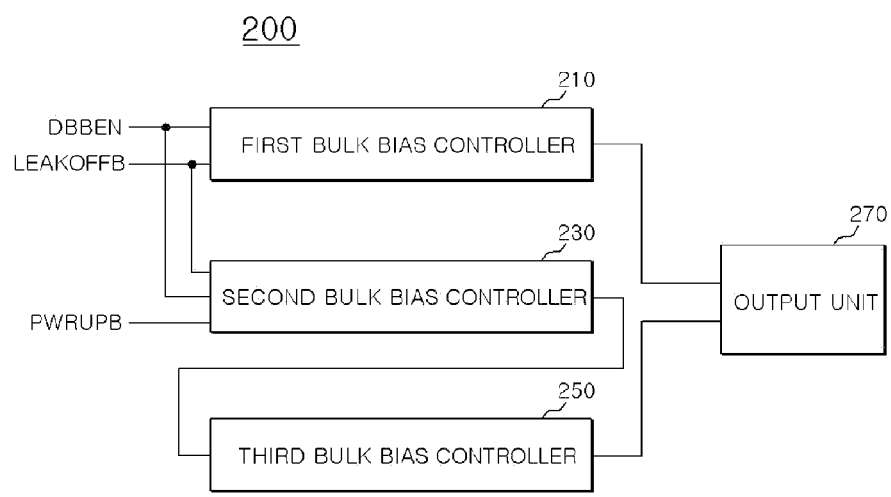
FIG. 4 is a block diagram illustrating a representation of a PMOS bulk bias generation block of FIG. 3.
Figure 5:
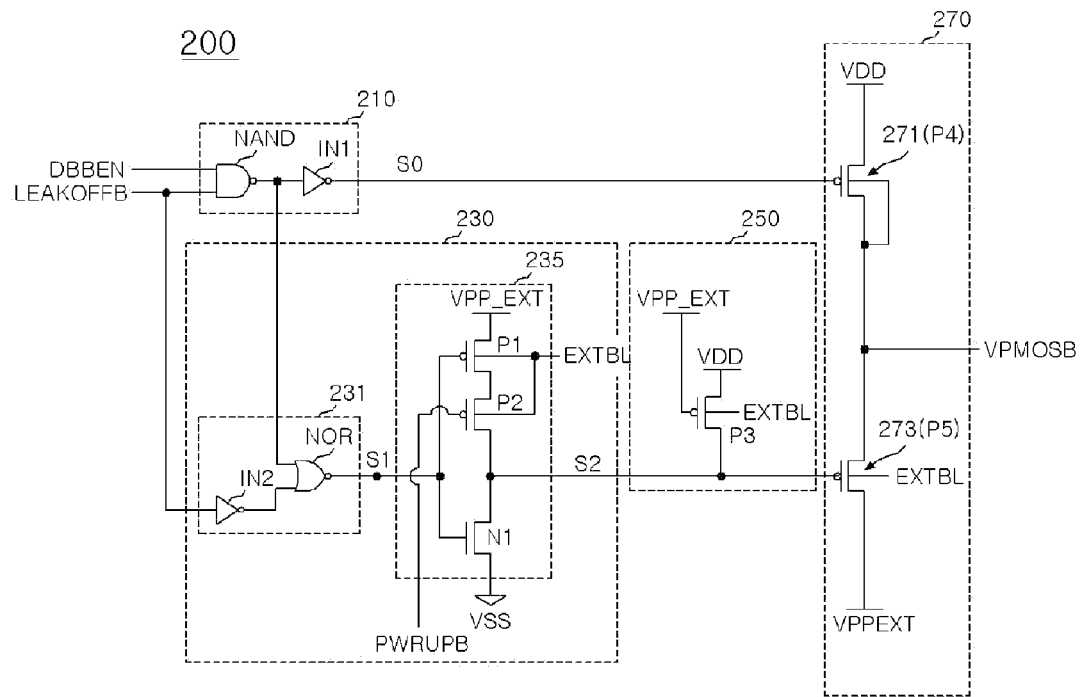
FIG. 5 is an internal circuit diagram illustrating a representation of a PMOS bulk bias generation block of FIG. 3.

Referring to FIGS. 4 and 5, the PMOS bulk bias generation block 200 may include a first bulk bias controller 210, a second bulk bias controller 230, a third bulk bias controller 250, and an output unit 270.

The first bulk bias controller 210 may be configured to control a bulk bias in a power-up period. The first bulk bias controller 210 may generate a first control signal S0 in response to a bulk bias enable signal DBBEN and a leakage signal LEAKOFFB. The bulk bias enable signal DBBEN is enabled to a high level only in a power-down mode, and is in default to a low level. The leakage signal LEAKOFFB may be enabled to a low level in abnormal driving of the first external voltage VDD and the second external voltage VPP_EXT. The first bulk bias controller 210 may perform an AND logic operation on the bulk bias enable signal DBBEN and the leakage signal LEAKOFFB and generate the first control signal S0. For example, the first bulk bias controller 210 may include a NAND gate NAND which receives the bulk bias enable signal DBBEN and the leakage signal LEAKOFFB, and a first inverter IN1 which inverts an output of the NAND gate NAND.

The second bulk bias controller 230 may be configured to control a bulk bias in a power-down mode. The second bulk bias controller 230 may generate a second control signal S2 in response to the bulk bias enable signal DBBEN, the leakage signal LEAKOFFB, and a power-up signal PWRUPB. The second bulk bias controller 230 may include an input signal generation unit 231. The second bulk bias controller 230 may also include a control signal output unit 235.

The input signal generation unit 231 may include a second inverter IN2. The input signal generation unit 231 may also include a NOR gate NOR. The second inverter IN2 is coupled to invert the leakage signal LEAKOFFB. The NOR gate NOR is configured to receive an inverted leakage signal LEAKOFFB and the output signal of the NAND gate NAND, perform an NOR operation on the inverted leakage signal LEAKOFFB and the output signal of the NAND gate NAND, and generate an input signal S1.

The control signal output unit 235 may generate the second control signal S2 in response to the input signal S1 output from the input signal generation unit 231 and the power-up signal PWRUPB. The control signal output unit 235 may include a first PMOS transistor P1, a second PMOS transistor P2, and a first NMOS transistor N1 coupled in series between a second external voltage terminal VPP_EXT and a ground voltage terminal VSS. The first PMOS transistor P1 and the NMOS transistor N1 may be driven in response to the input signal S1. The second PMOS transistor P2 may be driven in response to the power-up signal PWRUPB. Here, the power-up signal PWRUPB may be generated depending on the first external voltage VDD as illustrated in FIGS. 1 and 2. Therefore, the power-up signal PWRUPB in FIG. 1 may be actually enabled to a high level when the first external voltage VDD is generated, and the power-up signal PWRUPB in FIG. 2 may be enabled to a high level in the power-up period.

In an embodiment, a modified external bulk bias EXTBL may be applied to bulks of the first and second PMOS transistors P1 and P2 constituting the control signal output unit 235. A bulk of the first NMOS transistor N1 may be coupled to the ground voltage terminal VSS.

Figure 6:
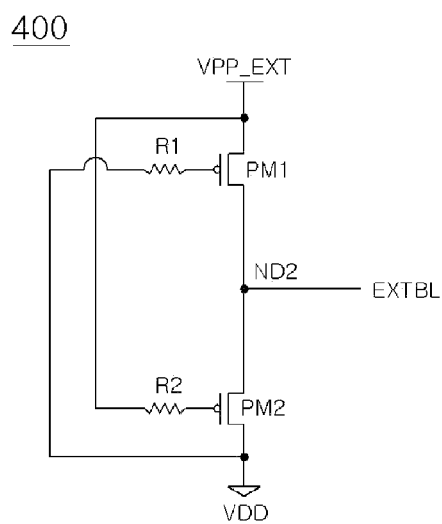
FIG. 6 is a circuit diagram illustrating a representation of an external bulk bias generation unit according to an embodiment.

Referring to FIG. 6, the modified external bulk bias EXTBL may be generated in an external bulk bias generation unit 400. The external bulk bias generation unit 400 may include a first PMOS transistor PM1 and a second PMOS transistor PM2.

A source of the first PMOS transistor PM1 may be coupled to the second external voltage terminal VPP_EXT. A drain of the first PMOS transistor PM1 may be coupled to an output node ND2. A gate of the first PMOS transistor PM1 may be coupled to the first external voltage terminal VDD. A source of the second PMOS transistor PM2 may be coupled to the output node ND2. A drain of the second PMOS transistor PM2 may be coupled to the first external voltage terminal VDD. A gate of the second PMOS transistor PM2 may be coupled to the second external voltage terminal VPP_EXT. A first resistor R1 may be coupled between the first external voltage terminal VDD and the gate of the first PMOS transistor PM1. A second resistor R2 may be coupled between the second external voltage terminal VPP_EXT and the gate of the second PMOS transistor PM2.

When the first external voltage VDD is not generated, and only the second external voltage VPP_EXT is output in the power-up period as described in FIG. 1, the first external voltage VDD substantially has a low level, and the first PMOS transistor PM1 of the external bulk bias generation unit 400 is driven. Therefore, the second external voltage VPP_EXT is output as the modified external bulk bias EXTBL. Further, when the second external voltage VPP_EXT is not generated, and only the first external voltage VDD is normally output in the power-up period as described in FIG. 2, the second external voltage VPP_EXT substantially has a low level, and the second PMOS transistor PM2 of the external bulk bias generation unit 400 is driven. Therefore, the first external voltage VDD is output as the modified external bulk bias EXTBL.

Generally, as the modified external bulk bias is also provided to the PMOS transistors constituting the PMOS bulk bias generation block, the leakage current due to an abnormal voltage application may be further prevented.

The third bulk bias controller 250 may be designed to originally prevent the leakage current which may be incidentally generated in the power-up period. The third bulk bias controller 250 may be configured to, in response to the second external voltage VPP_EXT, control a level of the second control signal S2. The third bulk bias controller 250 may include, for example, a PMOS transistor P3 driven in response to the second external voltage VPP_EXT. The PMOS transistor P3 may be configured to, in response to the second external voltage VPP_EXT, transfer the first external voltage VDD as the second control signal S2. The modified external bulk bias EXTBL may be provided as a bulk bias of the PMOS transistor P3.

The output unit 270 may include a first switching unit 271 and a second switching unit 273. The first switching unit 271 may include a PMOS transistor P4 which outputs the first external voltage VDD as the bulk bias VPMOSB of the PMOS transistor in response to the first control signal S0. A bulk of the PMOS transistor P4 may be coupled to a drain of the PMOS transistor P4. Even when the bulk of the PMOS transistor P4 is coupled to the drain, the second external voltage VPP_EXT, which is equal to or higher than a source voltage, is input. In the power-up mode, the second switching unit 273 may include a PMOS transistor P5 which outputs the second external voltage VPP_EXT as the bulk bias VPMOSB in response to the second control signal S2. The modified external bulk bias EXTBL may be applied to a bulk of the PMOS transistor P5 in the second switching unit 273.

Figure 7:
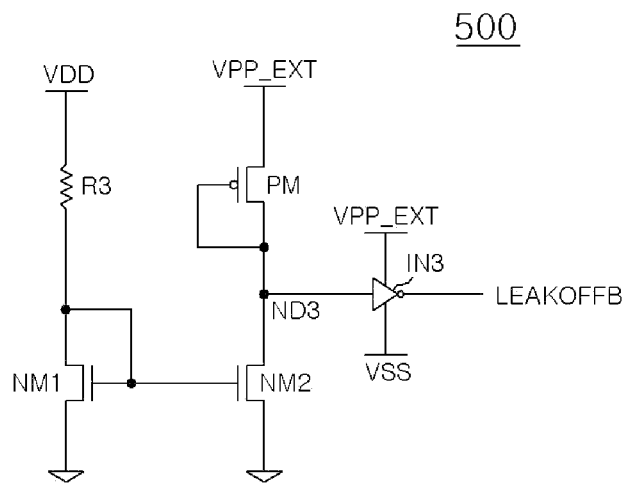
FIG. 7 is a circuit diagram illustrating a representation of a leakage detection circuit unit according to an embodiment.

Here, the leakage signal LEAKOFFB may be generated in a leakage detection circuit unit 500 illustrated in FIG. 7. The leakage detection circuit unit 500 may include a first NMOS transistor NM1, a second NMOS transistor NM2, a PMOS transistor PM, and an inverter IN3. The first NMOS transistor NM1 may have a drain coupled to one end of a voltage stabilization resistor R3 for receiving the first external voltage VDD through the voltage stabilization resistor R3. A source of the first NMOS transistor NM1 may be coupled with a ground voltage terminal VSS. A gate and the drain of the first NMOS transistor NM1 may be electrically coupled together and may simultaneously electrically coupled to a gate of the second NMOS transistor NM2 to create a current mirror. The second NMOS transistor NM2 may be coupled between a connection node ND3 and the ground voltage terminal VSS. The PMOS transistor PM may be coupled in a diode form, and may be coupled between the second external voltage terminal VPP_EXT and the connection node ND3. The inverter IN3 may be configured to invert a voltage of the connection node ND3 and output the leakage signal LEAKOFFB. The inverter IN3 may use the second external voltage VPP_EXT as a driving voltage.

In the leakage detection circuit unit 500, when the first external voltage VDD is not normally generated as illustrated in FIG. 1, the first and second NMOS transistors NM1 and NM2 are disabled in the power-up period, and the leakage signal LEAKOFFB having a low level is generated. Further, when the first external voltage VDD is normally input and the second external voltage VPP_EXT is abnormally input as illustrated in FIG. 2, the first and second NMOS transistors NM1 and NM2 are enabled in the power-up period, and the second external voltage VPP_EXT has a low level. Therefore, a signal having a low level is input to the inverter IN3. Since a driving voltage of the inverter IN3 corresponds to the second external voltage VPP_EXT, the leakage detection circuit unit 500 generates the leakage signal LEAKOFFB having a low level.

Figure 8:
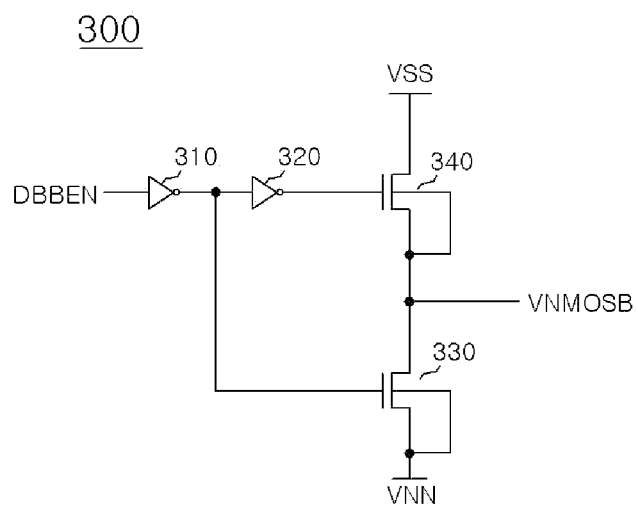
FIG. 8 is a block diagram illustrating a representation of an NMOS bulk bias generation block according to an embodiment.

Referring to FIG. 8, the NMOS bulk bias generation block 300 may be configured to output the ground voltage VSS and a negative voltage VNN having a larger absolute value than the ground voltage in response to the bulk bias enable signal DBBEN. The NMOS bulk bias generation block 300 may include a first inverter 310, a second inverter 320, a first NMOS transistor 330, and a second NMOS transistor 340. The first inverter 310 may be configured to receive the bulk bias enable signal DBBEN and invert the bulk bias enable signal DBBEN. The second inverter 320 may be configured to invert an output signal of the first inverter 310. The first NMOS transistor 330 may be coupled between an output node and a negative voltage terminal VNN, and may provide the negative voltage VNN as the bulk bias VNMOSB of the NMOS transistor in response to the output signal of the first inverter 310. The second NMOS transistor 340 may be coupled between the output node and the ground voltage terminal VSS. The second NMOS transistor 340 may output the ground voltage VSS as the bulk bias VNMOSB of the NMOS transistor in response to an output signal of the second inverter 320.

The NMOS bulk bias generation block 300 may provide the ground voltage VSS as the bulk bias VNMOSB of the NMOS transistor when the bulk bias enable signal DBBEN is disabled to a low level in the power-up period. Further, the NMOS bulk bias generation block 300 may apply the negative voltage VNN as the bulk bias VNMOSB of the NMOS transistor when the bulk bias enable signal DBBEN is enabled to a high level in the power-down mode.

The operation of the PMOS bulk bias generation block 200 having the above-described configuration in the semiconductor integrated circuit device 100 will be described below.

First, the cases in which the first external voltage VDD is not normally generated in the power-up period as illustrated in FIG. 1 will be described.

As illustrated in FIG. 1, when the second external voltage VPP_EXT is normally generated, but the first external voltage VDD is not normally generated, the leakage detection circuit unit 500 may generate the leakage signal LEAKOFFB having a low level as described above. In the power-up period, the bulk bias enable signal DBBEN may be disabled to a low level.

The first bulk bias controller 210 may generate the first control signal S0 having a low level according to input of the bulk bias enable signal DBBEN of a low level and the leakage signal LEAKOFFB of a low level. Thus, the first switching unit 271 may be driven to output the first external voltage VDD as the bulk bias VPMOSB of the PMOS transistor. At this time, in FIG. 1, since the first external voltage VDD of 0(zero) V is input as a driving voltage of the PMOS transistor in the power-up period, the bulk voltage substantially becomes equal to the source voltage, and thus the leakage current is not generated due to bulk voltage reversal.

The input signal generation unit 231 of the second bulk bias controller 230 receives the leakage signal LEAKOFFB of a low level and the output signal of the NAND gate NAND which is a high level, and may generate the input signal S1 having a low level. As the input signal S1 having the low level and the power-up signal (see PWRUPB of FIG. 1) having a low level are input, the first and second PMOS transistors P1 and P2 of the control signal output unit 235 are enabled, and the first NMOS transistor N1 is disabled. Thus, the second external voltage VPP_EXT is output as the second control signal S2. Since the second external voltage VPP_EXT having a relatively stable level is provided to the bulks of the first and second PMOS transistors P1 and P2 as the modified external bulk bias EXTBL, the incidental leakage current may be reduced.

The third bulk bias controller 250 is disabled by the second external voltage VPP_EXT having a normal voltage level. Thus, the third bulk bias controller 250 completely maintains the second control signal S2 to a high level. The second switching unit 273 is disabled by the second control signal S2 maintained to the high level. Therefore, the second external voltage VPP_EXT is interrupted to be provided as the bulk voltage, and the leakage current may be completely interrupted.

Therefore, in the power-up period in which the first external voltage VDD of 0 V is output as illustrated in FIG. 1, the first external voltage VDD is output as the bulk bias VPMOSB of the PMOS transistor. Since the driving voltage and the bulk voltage of the PMOS transistor are equally maintained to 0 V, the leakage current due to the bulk voltage reversal may not be caused.

Now, the cases in which the second external voltage VPP_EXT is not normally generated in the power-up period as illustrated in FIG. 2 will be described below.

When the first external voltage VDD is normally generated, but the second external voltage VPP_EXT is not normally generated, the leakage detection circuit unit 500 may generate the leakage signal LEAKOFFB having a low level as described above. Thus, the first bulk bias controller 210 inputs the bulk bias enable signal DBBEN of a low level and the leakage signal LEAKOFFB of a low level to generate the first control signal S0 having a low level. Thus, the first switching unit 271 is enabled, and the first external voltage VDD is output as the bulk bias VPMOSB.

The input signal generation unit 231 of the second bulk bias controller 230 may receive the leakage signal LEAKOFFB of a low level and the output signal of the NAND gate NAND which is a high level, and may generate the input signal S1 having a low level. As the input signal S1 having the low level and the power-up signal PWRUPB having a high level are input, the first PMOS transistor P1 is enabled, and the second PMOS transistor P2 and the first NMOS transistor N1 are disabled. Thus, the second control signal S2 having a floating state is output.

At this time, since the second external voltage VPP_EXT is 0 V, the third bulk bias controller 250 is enabled to strap the second control signal S2 to a high level. Thus, the second switching unit 273 is completely disabled, and the first external voltage VDD is provided as the bulk bias VPMOSB of the PMOS transistor. Therefore, even when the second external voltage VPP_EXT is varied to a level below the first external voltage VDD, the bulk voltage reversal may not occur.

Next, the operation of the PMOS bulk bias generation block 200 in the power-down mode will be described below.

In the power-down mode, the bulk bias enable signal DBBEN and the leakage signal LEAKOFFB may have high levels.

Thus, the first bulk bias controller 210 may receive the bulk bias enable signal DBBEN of a high level and the leakage signal LEAKOFFB of a high level, and may generate the first control signal S0 having a high level. Therefore, the first switching unit 271 may be disabled.

The input signal generation unit 231 of the second bulk bias controller 230 may receive the leakage signal LEAKOFFB of a high level and the output signal of the NAND gate NAND which is a low level, and may generate the input signal S1 having a high level. As the input signal S1 having the high level and the power-up signal PWRUPB disabled to a low level are input, the first PMOS transistor P1 is disabled, and second PMOS transistor P2 and the first NMOS transistor N1 are enabled. Thus, the control signal output unit 235 generates the second control signal S2 having a low level. At this time, since the second external voltage VPP_EXT has a high level, the third bulk bias controller 250 is disabled. Therefore, the second switching unit 273 is enabled by the second control signal S2, and the second external voltage VPP_EXT is provided as the bulk bias VPMOSB of the PMOS transistor.

In the power-down mode in which the first external voltage VDD and the second external voltage VPP_EXT are not changed, the second external voltage VPP_EXT having a larger level than the first external voltage VDD is input as the bulk bias. Thus, the leakage current may be reduced.

According to an embodiment, the PMOS bulk bias generation block allows the first external voltage VDD to be applied as the bulk bias of the PMOS transistor in the power-up period in which any one of the first external voltage VDD and the second external voltage VPP_EXT may be abnormally generated, and sets the second external voltage VPP_EXT higher than the first external voltage VDD provided as the bulk bias of the PMOS transistor in the power-down mode.

Therefore, the bulk voltage of the PMOS transistor constituting a circuit using a hetero-voltage source, which has a voltage level higher than or equal to that of a source voltage may be applied in any mode. Thus, the leakage current generated when the source voltage surpasses the bulk voltage may be reduced.

Figure 9:
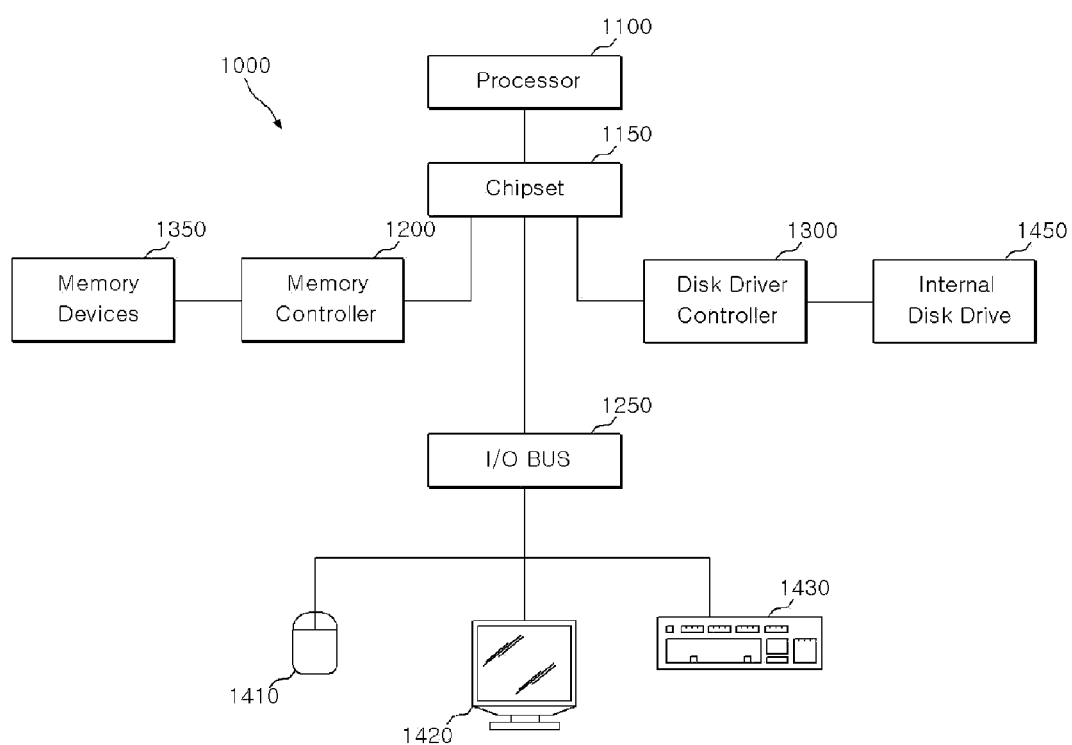
FIG. 9 illustrates a block diagram of an example of a representation of a system employing the semiconductor integrated circuit devices and/or methods in accordance with the embodiments discussed above with relation to FIGS. 1-8.

The semiconductor integrated circuit devices and/or methods discussed above (see FIGS. 1-8) are particular useful in the design of memory devices, processors, and computer systems. For example, referring to FIG. 9, a block diagram of a system employing the semiconductor integrated circuit devices and/or methods in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor integrated circuit device and/or employ the methods as discussed above with reference to FIGS. 1-8. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor integrated circuit device and/or employ the methods as discussed above with relation to FIGS. 1-8, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing the semiconductor integrated circuit devices and/or methods as discussed above with relation to FIGS. 1-8. In alternate embodiments, such as cellular phones or digital cameras, the components may differ from the embodiments illustrated in FIG. 9.

The above embodiments are illustrative and not limitative. Various alternatives and equivalents are possible. The embodiments not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a PMOS bulk bias generation block configured to output a first external voltage as a bulk voltage of a PMOS transistor in a power-up period, and output a second external voltage as the bulk voltage of the PMOS transistor in a power-down mode, in response to a bulk bias enable signal configured to be enabled in the power-down mode and a leakage signal; and
   a NMOS bulk bias generation block configured to output a ground voltage as a bulk voltage of an NMOS transistor in the power-up period, and output a negative voltage as the bulk voltage of the NMOS transistor in the power-down mode, in response to the bulk bias enable signal,
   wherein the second external voltage has a higher level than the first external voltage, and
   wherein the negative voltage has a larger absolute value than the ground voltage.

2. The semiconductor integrated circuit device of claim 1, wherein the PMOS bulk bias generation block includes:
   a first bulk bias controller configured to generate a first control signal enabled when leakage occurs in the power-up period in response to the bulk bias enable signal and the leakage signal;
   a second bulk bias controller configured to generate a second control signal enabled in the power-down mode in response to the bulk bias enable signal, the leakage signal, and a power-up signal;
   a third bulk bias controller configured to strap the second control signal to a disabled state in the power-up period; and
   an output unit configured to output the first external voltage in response to the first control signal, and to output the second external voltage in response to the second control signal.

3. The semiconductor integrated circuit device of claim 2, wherein the first bulk bias controller is configured to perform an AND operation on the bulk bias enable signal and the leakage signal.

4. The semiconductor integrated circuit device of claim 2, wherein the second bulk bias controller includes:
   an input signal generation unit configured to receive a NAND-operated signal of the bulk bias enable signal and the leakage signal and an inverted leakage signal, and perform a NOR operation on the NAND-operated signal and the inverted leakage signal; and
   a control signal output unit configured to perform an inversion and amplification operation in response to an input signal generated in the input signal generation unit and the power-up signal.

5. The semiconductor integrated circuit device of claim 2, wherein the third bulk bias controller includes a PMOS transistor configured to provide the first external voltage as the second control signal in response to the second external voltage.

6. The semiconductor integrated circuit device of claim 2, wherein at least one of the first to third bulk bias controllers and the output unit includes at least one PMOS transistor, and
   a modified external bulk bias is provided as a bulk bias of the at least one PMOS transistor constituting the at least one of the first to third bulk bias controllers and the output unit.

7. The semiconductor integrated circuit device of claim 6, further comprising an external bulk bias generation unit configured to generate the modified external bulk bias,
   wherein the modified bulk bias generation unit includes:
   a first PMOS transistor configured to provide the second external voltage as the modified external bulk bias to an output node in response to the first external voltage; and
   a second PMOS transistor electrically coupled to the output node and configured to provide the first external voltage as the modified external bulk bias to the output node in response to the second external voltage.

8. The semiconductor integrated circuit device of claim 1, wherein the leakage signal is generated using the first external voltage and the second external voltage, and the leakage signal is enabled to a low level when any one of the first external voltage and the second external voltage is abnormally output in the power-up period.

* * * * *